US006802721B2

United States Patent
Sanada et al.

(10) Patent No.: US 6,802,721 B2
(45) Date of Patent: Oct. 12, 2004

(54) ELECTRONIC DEVICE IN WHICH A CIRCUIT BOARD AND AN ELECTRIC CONNECTOR ARE ELECTRICALLY CONNECTED BY A FLEXIBLE PRINTED WIRING BOARD

(75) Inventors: Kazuya Sanada, Kariya (JP); Toshiaki Yagura, Nukata-gun (JP); Satoru Kawamoto, Chita-gun (JP); Akihiro Yanagisawa, Toyohashi (JP)

(73) Assignee: Denso Corporation (JP)

( * ) Notice: Subject to any disclaimer, the term of this patent is extended or adjusted under 35 U.S.C. 154(b) by 0 days.

(21) Appl. No.: 10/351,368

(22) Filed: Jan. 27, 2003

(65) Prior Publication Data

US 2003/0143871 A1 Jul. 31, 2003

(30) Foreign Application Priority Data

Jan. 31, 2002 (JP) ........................................ 2002-024059

(51) Int. Cl.[7] .............................................. H01R 12/00
(52) U.S. Cl. ........................... 439/67; 439/76.1; 439/77
(58) Field of Search ........................... 439/67, 76.1, 77, 439/79, 493, 83; 361/749

(56) References Cited

U.S. PATENT DOCUMENTS

| | | | | |
|---|---|---|---|---|
| 4,618,739 A | * | 10/1986 | Theobald .................. | 174/52.4 |
| 4,868,638 A | * | 9/1989 | Hirata et al. ................. | 257/697 |
| 5,059,756 A | * | 10/1991 | Henschenp et al. ....... | 219/85.22 |
| 5,357,074 A | * | 10/1994 | Pawlikowski ............ | 219/85.18 |
| 5,362,243 A | * | 11/1994 | Huss et al. ................. | 439/76.1 |
| 5,764,497 A | * | 6/1998 | Mizumo ..................... | 361/803 |
| 5,777,850 A | * | 7/1998 | Jakob et al. ................ | 361/736 |
| 6,031,730 A | * | 2/2000 | Kroske ....................... | 361/784 |
| 2001/0015887 A1 | | 8/2001 | Sanada et al. | |

* cited by examiner

Primary Examiner—Tho D. Ta
Assistant Examiner—X. Chung-Trans
(74) Attorney, Agent, or Firm—Nixon & Vanderhye PC

(57) ABSTRACT

An electronic device includes a circuit board, a flexible printed wiring board, and an electric connector. The circuit board includes an electronic circuit. The flexible printed wiring board is electrically connected to the electronic circuit. The electric connector includes a plurality of leads and a connector body. Each lead has a substantially straight end and a bent end. A surface of the connector body is substantially parallel to a surface of the flexible printed wiring board. Each bent end of the leads is located on the surface of the connector body to be substantially parallel to the surface of the flexible printed wiring board. The connector is electrically connected to the flexible printed wiring board using the leads. With the structure of the connector, the circuit board and the electric connector is relatively readily connected by the flexible printed wiring board in the manufacturing process of the electronic device.

14 Claims, 7 Drawing Sheets

ELECTRONIC DEVICE IN WHICH A CIRCUIT BOARD AND AN ELECTRIC CONNECTOR ARE ELECTRICALLY CONNECTED BY A FLEXIBLE PRINTED WIRING BOARD

CROSS REFERENCE TO RELATED APPLICATION

This application is based on and incorporates herein by reference Japanese Patent Application No. 2002-24059 filed on Jan. 31, 2002.

BACKGROUND OF THE INVENTION

The present invention relates to an electronic device in which a circuit board, which includes an electronic circuit, and an electric connector are connected by a flexible printed wiring board (PWB) for establishing an electric connection between the electronic circuit and an external electronic device.

JP-A-2001-237575 discloses that kind of electronic device, which is shown in FIG. 1A. In the manufacturing process of the electronic device of FIG. 1A, leads 502a of an electric connecter 502 are inserted into through-holes of a flexible PWB 504, and the leads 502a and wires of the flexible PWB 504 are electrically connected by soldering. Then, the flexible PWB 504 and each of the circuit boards 510, 520 contained in the device are overlapped, and the overlapping portions of the flexible PWB 504 and the circuit boards 510, 520 are heat pressed to solder wires of the flexible PWB 504 and electric terminals of the circuit boards 510, 520.

On the other hand, JP-A-2001-267022 discloses an electronic device, which is shown in FIG. 1B. In the manufacturing process of the electronic device of FIG. 1B, leads 502a of an electric connecter 502 are inserted into through-holes of a rigid PWB 550, and the leads 502a and wires of the rigid PWB 550 are connected by soldering. Then, the rigid PWB 550 is electrically connected to each of the circuit boards 510, 520 contained in the device using flexible PWBs 504.

However, in the former manufacturing process, the method for connecting the leads 502a and the PWB 504 is different from that for connecting the flexible PWB 504 and each of the circuit boards 510, 520. In the later manufacturing process as well, the method for connecting the leads 502a and the PWB 550 is different from that for connecting each flexible PWB 504 and each of the circuit boards 510, 520. Therefore, either manufacturing process requires two types of connecting apparatuses and is relatively complicated.

SUMMARY OF THE INVENTION

The present invention has been made in view of the above aspects with an object to provide an electronic device in the manufacturing process of which a circuit board and an electric connector is relatively readily connected by a flexible PWB.

In the present invention, an electronic device includes a circuit board, a flexible PWB, and an electric connector. The circuit board includes an electronic circuit. The flexible PWB is electrically connected to the electronic circuit. The electric connector includes a plurality of leads and a connector body. Each lead has a substantially straight end and a bent end. A surface of the connector body is substantially parallel to a surface of the flexible PWB. Each bent end of the leads is located on the surface of the connector body to be substantially parallel to the surface of the flexible PWB. The connecter is electrically connected to the flexible PWB using the leads. With the structure of the connector, the circuit board and the electric connector is relatively readily connected by the flexible PWB in the manufacturing process of the electronic device.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

The present invention will be described in detail with reference to various embodiments.

First Embodiment

Figure 1A:
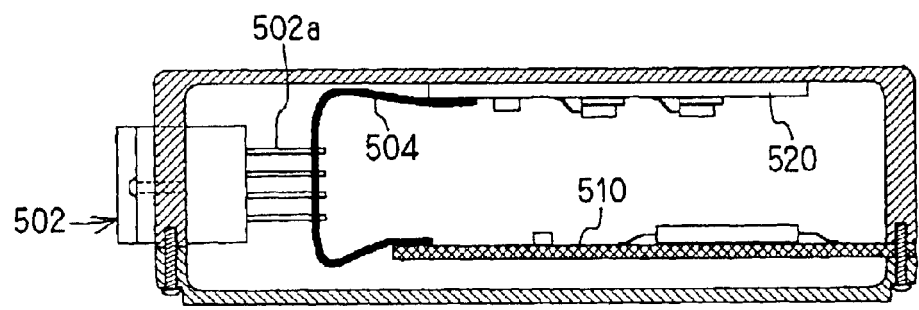
FIGS. 1A and 1B are cross-sectional views of proposed electronic devices.
Figure 1B:
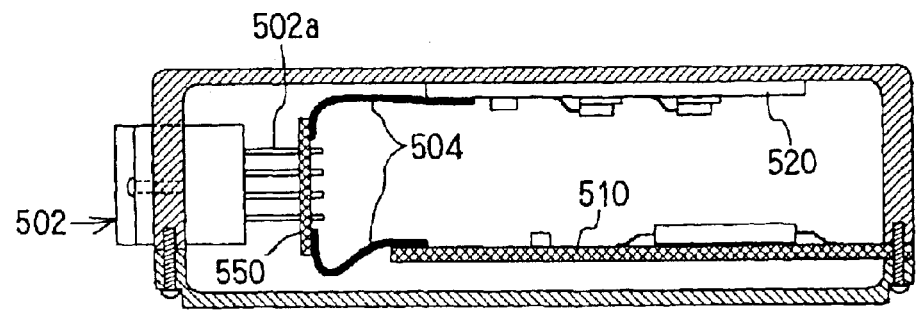
Figure 2A:
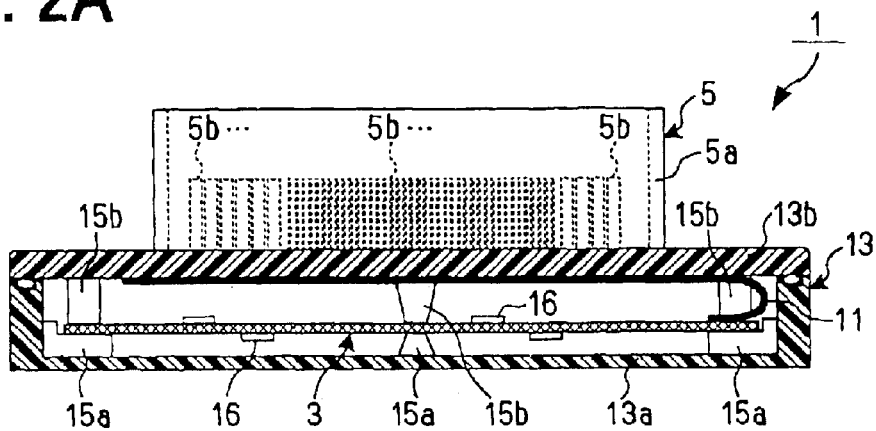
FIG. 2A is a cross-sectional view of an electronic device according to a first embodiment of the present invention.
Figure 2B:
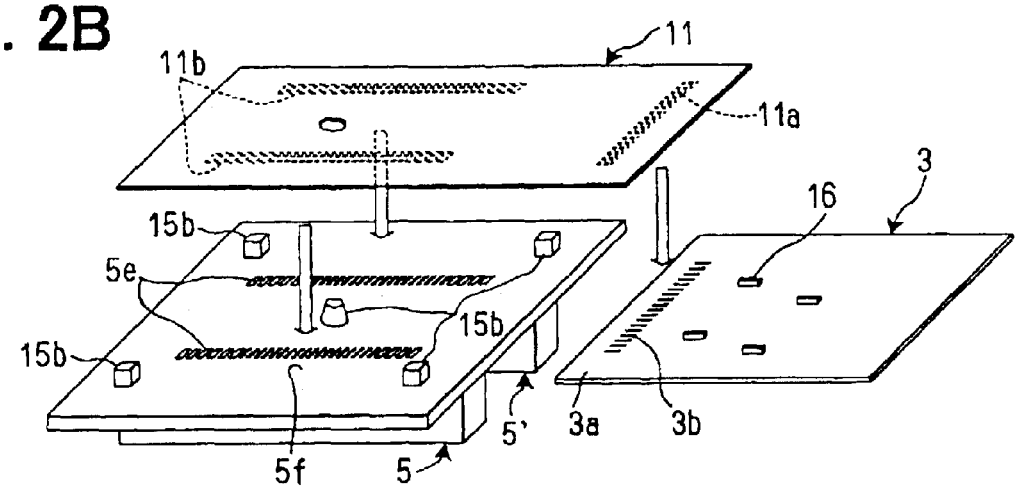
FIGS. 2B and 2C are respectively a perspective view and cross-sectional view that show process steps for manufacturing the electronic device of FIG. 2A.

As shown in FIG. 2A, an electronic device 1 according to a first embodiment includes a circuit board 3, a flexible PWB 11, an electric connector 5, and a case 13. The circuit board 3 and the electric connector 5 are electrically connected by the flexible PWB 11 for establishing an electric connection between an electronic circuit located in the circuit board 3 and an external electronic device. Specifically, first electric terminals 11a of the flexible PWB 11 are electrically connected to electric terminals 3b located at an end 3a of the circuit board 3, and second electric terminals 11b of the flexible PWB 11 are electrically connected to bent ends 5e of leads 5b, which jut out from a connector body 5a of the connector 5, as shown in FIGS. 2A and 2B.

As shown in FIG. 2A, the case 13 includes a case body 13a and a lid 13b. The case body 13a has an opening and a space for accommodating the circuit board 3 and the flexible PWB 11. The space communicates with the outside of the case body 13a through the opening. The case body 13a includes supporting portions 15a. The lid 13b is used to close the opening. The lid 13b includes supporting portions 15b. The circuit board 3 is clamped between each supporting portion 15a of the case body 13a and each supporting portion 15b of the lid 13b. A variety of chip components 16 are packaged on the circuit board 3 to form the electronic circuit.

Figure 3A:
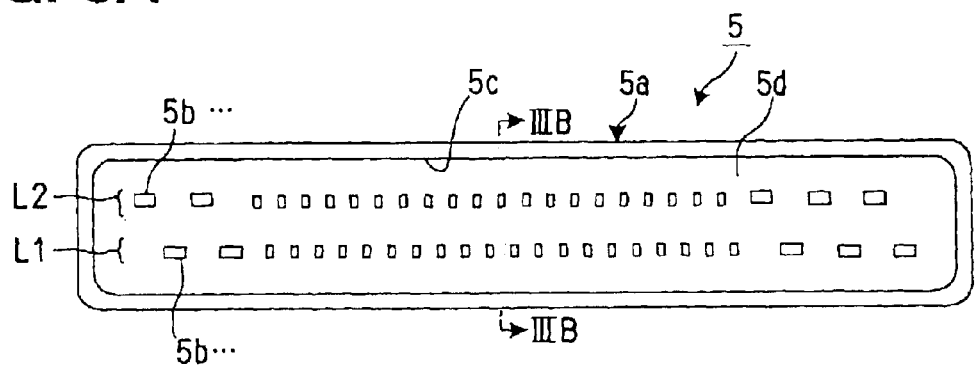
FIG. 3A is a front view of a connector according to the first embodiment showing an arrangement of leads.

As shown in FIG. 2A, the connector body 5a, which is made of insulating plastics, is integrated with the lid 13b. The connector body 5a has an opening 5c at its front end in FIG. 3A. The connector body 5a has a space that communicates with the outside of the connector body 5a through the opening. Although not illustrated, a connecter of wire harness is plugged into the space through the opening 5c. The connector body 5a also has a rear wall 5d at its rear end in FIG. 3A. Each pin-like straight end of the leads 5b sticks out of the front surface of the rear wall 5d and extends toward the opening 5c in FIG. 3A. The straight ends are staggered in two rows L1, L2 that are substantially parallel to each other, as illustrated in FIG. 3A.

Figure 3B:
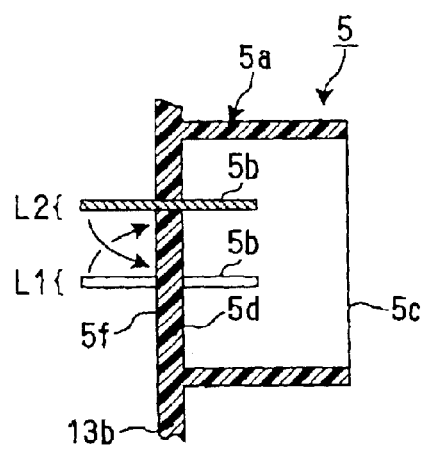
FIG. 3B is a cross-sectional view of the connector taken along the line IIIB—IIIB in FIG. 3A.
Figure 3C:
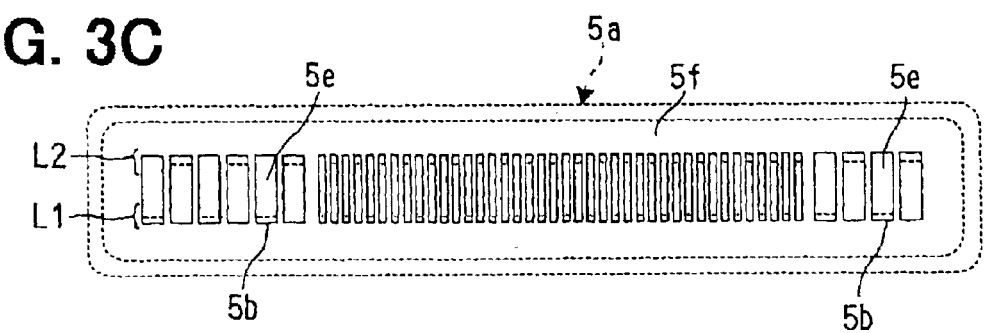
FIG. 3C is a rear view of the connector according to the first embodiment showing the arrangement of the leads.

Each bent end 5e of the leads 5b is located on a rear surface 5f of the rear wall 5d, as shown in FIG. 3C. The rear surface 5f faces the flexible PWB 11. As shown in FIG. 3C, each bent end 5e of the leads 5b is substantially parallel to the rear surface 5f and extends substantially orthogonally to the rows L1, L2 of straight ends while the bent ends 5e are in a row. The connector 5 is electrically connected to the flexible PWB 11 at the bent ends 5e. As shown in FIG. 3B, the bent ends 5e are formed by bending ends of straight pins 5b in a first row L1 and ends of straight pins 5b in a second row L2 respectively toward the direction denoted by corresponding arrows. That is, each end of the pins 5b in each row L1 (L2) is bent toward the other row L2 (L1).

Although electronic device 1 of FIG. 2A includes another connector 5' as shown in FIG. 2B, the another connector 5' has the same structure as the connecter 5. Therefore, no explanation is reiterated on the another connector 5'.

Process steps for electrically connecting the flexible PWB 11 to the connector 5 and the circuit board 3 will be described next. The second electric terminals 11b and the bent ends 5e of the leads 5b are soldered by heat pressing the flexible PWB 11 to the connecter 5, which is integrated with the lid 13b and fixed by a jig, which is not illustrated, to face toward a predetermined direction as shown in FIG. 2B. The first electric terminals 11a and the electric terminals 3b of the circuit board 3 are also soldered by heat pressing the flexible PWB 11 to the circuit board 3, which is fixed by a jig, which is not illustrated, to face toward a predetermined direction as shown in FIG. 2B.

Figure 4:
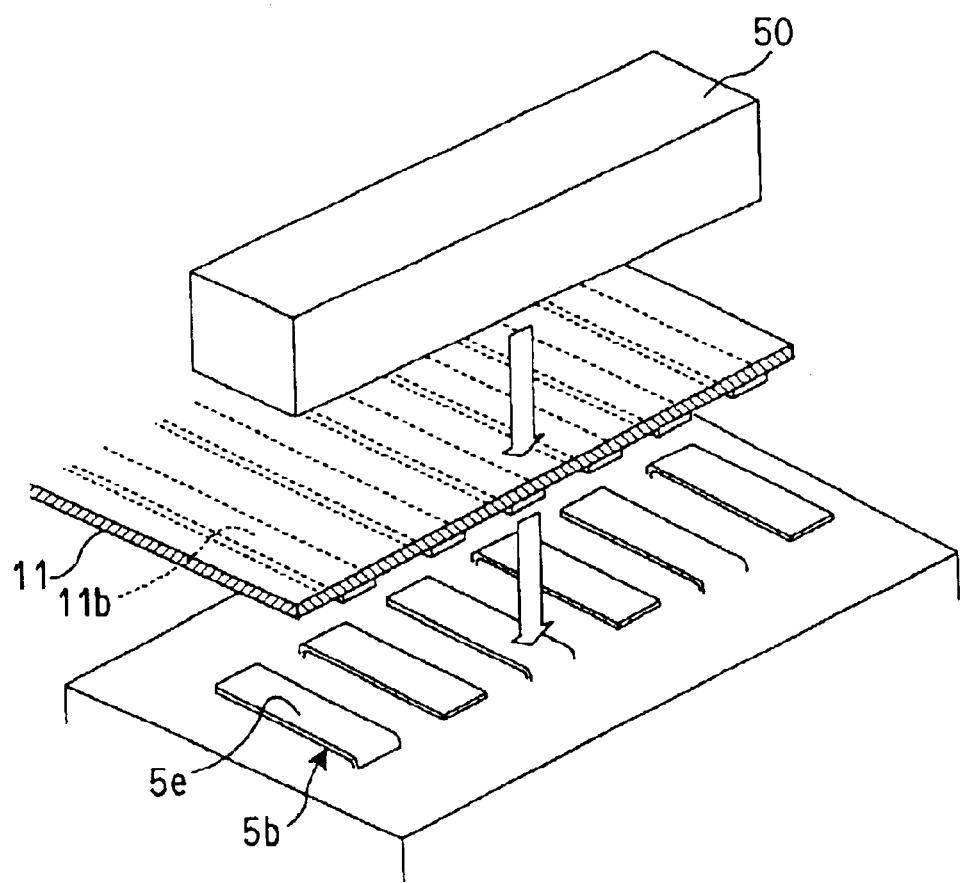
FIG. 4 is a view showing the soldering method by heat pressing.

The soldering by the heat pressing is specifically done as follows. A soldering material is placed beforehand on the first and second electric terminals 11a, 11b of the flexible PWB 11, the bent ends 5e of the leads 5b, and the electric terminals 3b of the circuit board 3. Then, as shown in FIG. 4, the flexible PWB 11 is heat pressed to the connecter 5 using heater 50. With the heat pressing, the flexible PWB 11 and the connecter 5 contact hard each other, and the soldering material on the second electric terminals 11b and the bent ends 5e is fused by the heat from the heater 50. Although not illustrated, the flexible PWB 11 and the circuit board 3 are soldered by heat pressing in the same manner.

Figure 2C:
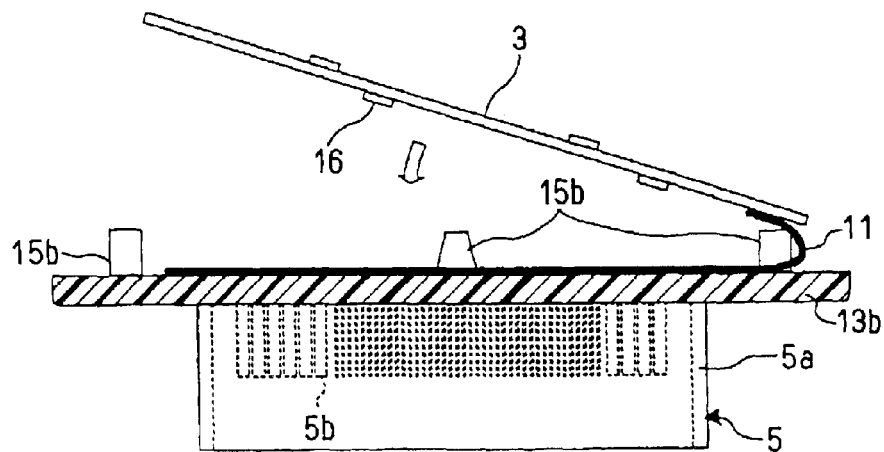

After the soldering by the heat pressing, as shown in FIG. 2C, the circuit board 3 is bent to overlie the lid 13b and to be supported by the supporting portions 15b. Then, the case body 13a is attached to the lid 13b to accommodate the circuit board 3 and the flexible PWB 11 within the space of the case body to complete the electronic device 1 of FIG. 2A.

The electronic device 1 of FIG. 2A offers, for example, the following preferable effects.

As shown in FIG. 3C, the bent ends 5e of the leads 5b, which are located on the rear surface 5f, are substantially parallel to the rear surface 5f, which faces the flexible PWB 11. Therefore, the bent ends 5e can be readily electrically connected to the second electric terminals 11b by heat pressing the connector 5 and the flexible PWB 11 after aligning the bent ends 5e with the second electric terminals 11b. That is, with the soldering by heat pressing, the connector 5 and the flexible PWB 11 can be electrically connected together as readily as the flexible PWB 11 and the circuit board 3 are.

The soldering material on the second electric terminals 11b and the bent ends 5e is fused by the heat from the heater 50. Therefore, it is preferred that the heater 50 be as small as possible from the standpoint of the readiness for temperature control. Moreover, it is preferred that the heat pressed area be as small as possible from the standpoint of the readiness and expeditiousness for heat pressing. As shown in FIG. 3C, the bent ends 5e of the leads 5b extend substantially orthogonally to the rows L1, L2 of straight ends while the bent ends 5e are in a row. Therefore, the heater 50 can be relatively small, and the connector 5 and the flexible PWB 11 are relatively readily and expeditiously soldered by heat pressing.

Second Embodiment

Figure 5A:
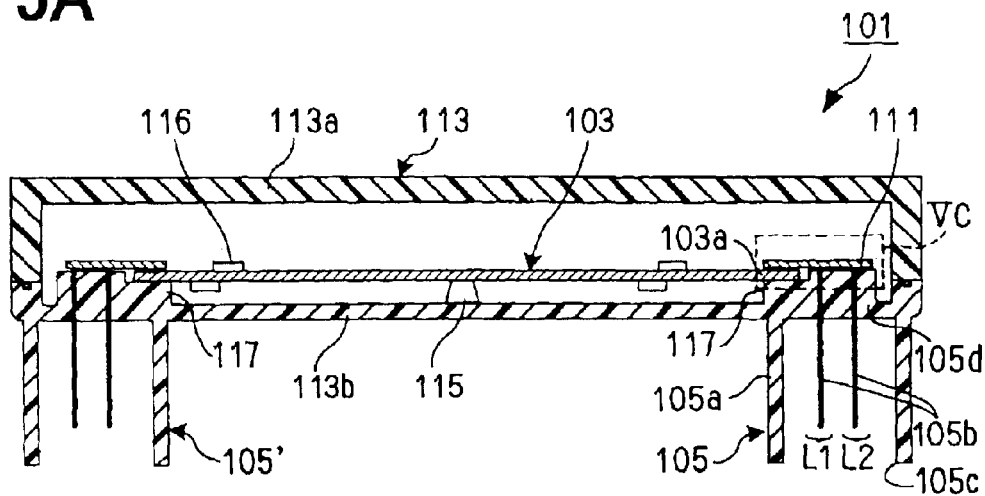
FIG. 5A is a cross-sectional view of an electronic device according to a second embodiment of the present invention.
Figure 5B:
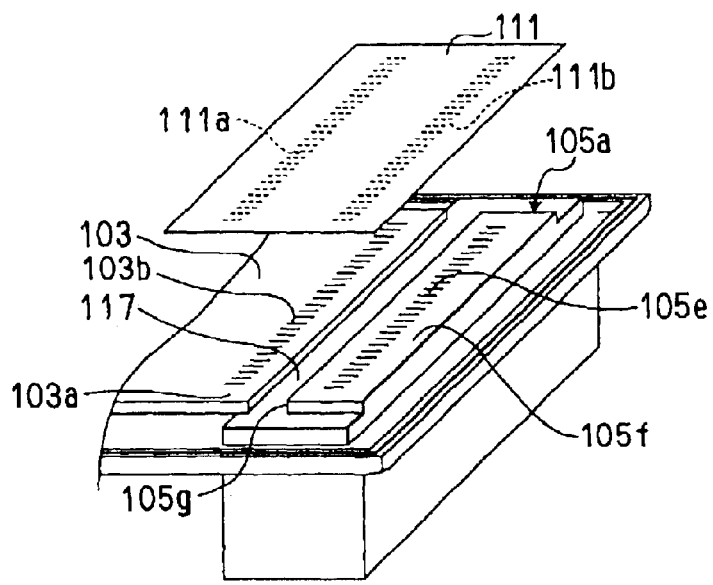
FIG. 5B is a perspective view showing a process step for manufacturing the electronic device of FIG. 5A.

As shown in FIG. 5A, an electronic device 101 according to a second embodiment includes a circuit board 103, a flexible PWB 111, an electric connector 105, and a case 113. The circuit board 103 and the electric connector 105 are electrically connected by the flexible PWB 111 for establishing an electric connection between an electronic circuit located on the circuit board 103 and an external electronic device. Specifically, first electric terminals 111a of the flexible PWB 111 are electrically connected to electric terminals 103b of the circuit board 103, and second electric terminals 111b of the flexible PWB 111 are electrically connected to bent ends 105e of leads 105b, which jut out from a connector body 105a of the connector 105, as shown in FIGS. 5A and 5B.

As shown in FIG. 5A, the case 113 includes a case body 113a and a case component 113b, or a lid 113b. The case body 113a has an opening and a space for accommodating the circuit board 103 and the flexible PWB 111. The space communicates with the outside of the case body 113a through the opening. The lid 113b is used to close the opening. In the case 113, the circuit board 103, which is substantially square, is supported by a center supporting portion 115 of the lid 113b and a peripheral supporting portion 117 of the connector body 105a at a central area and an end 103a of the circuit board 103, respectively.

The circuit board 103 is fixed to the connector body 105a by screws, which are not illustrated in the drawing, at positions where the electronic circuit located in the circuit board 103 is not affected. Instead of screws, an adhesive may be used. A variety of chip components 116 are packaged on the circuit board 103 to form the electronic circuit.

As shown in FIG. 5A, the connector body 105a is made of insulating plastics and integrated with the lid 113b. The connector body 105a has an opening 105c at its lower end in FIG. 5A. The connector body 105a has a space that communicates with the outside of the connector body 105a through the opening. Although not illustrated, a connecter of wire harness is plugged into the space through the opening 105c. The connector body 105a also has an upper wall 105d at its upper end in FIG. 5A. Each pin-like straight end of the leads 105b sticks out of the lower surface of the upper wall 105d and extends downward toward the opening 105c in FIG. 5A. The pin-like straight ends are staggered in two rows L1, L2 that are substantially parallel to each other, as illustrated in FIG. 5A.

Each bent end of the leads 105b is located on an upper surface 105f of the upper wall 105d, or an upper connector surface 105f, as shown in FIG. 5B. The upper connector surface 105f faces the flexible PWB 111. As shown in FIG. 5B, each bent end 105e of the leads 105b is substantially parallel to the upper connector surface 105f and extends substantially orthogonally to the rows L1, L2 of straight ends while the bent ends 105e are in a row. The connector 105 is electrically connected to the flexible PWB 111 at the bent ends 105e. The bent ends 105e are formed by bending ends of straight pins in two rows.

Figure 5C:
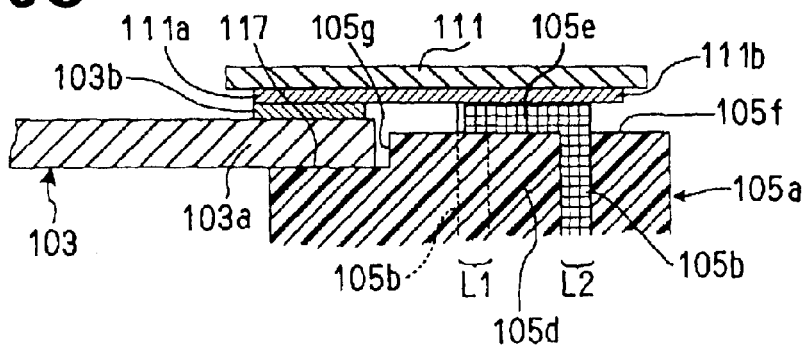
FIG. 5C is an enlarged cross-sectional view of the area VC in FIG. 5A.

The upper connector surface 105f is located outside the circuit board 103 such that the upper connector surface 105f and the circuit board 103 do not overlap. As shown in FIG. 5C, there is a step 105g between the horizontal surface of the peripheral supporting portion 117 and the upper connector surface 105f. As shown in FIG. 5C, the upper connector surface 105f is located at a level higher than the horizontal surface of the peripheral supporting portion 117 such that upper surfaces of the electric terminals 103b, at which the electric terminals 103b are connected to the first electric terminals 111a, and connection surfaces, or upper surfaces, of the bent ends 105e, at which the bent ends 105e are connected to the second electric terminals 111b, are substantially at the same level.

Although the electronic device 101 of FIG. 5A includes another connector 105', the another connector 105' has the same structure as the connecter 105 and located across the circuit board 103 from the end 103a, where the connecter 105 is located. The another connector 105' also has a peripheral supporting portion 117 for supporting the circuit board 103.

Process steps for electrically connecting the flexible PWB 111 to the connector 105 and the circuit board 103 will be described next. As shown in FIG. 5B, the first and second electric terminals 111a, 111b are respectively soldered to the electric terminals 103b of the circuit board 103 and the bent ends 105e of the leads 105b by heat pressing the flexible PWB 111 to the connecter 105, which is fixed such that the upper connector surface 105f faces the flexible PWB 111, and the end 103a of the board 103, which is fixed to the peripheral supporting portion 117.

The soldering by the heat pressing is specifically done as follows. A soldering material is placed beforehand on the first and second electric terminals 111a, 111b of the flexible PWB 111, the bent ends 105e of the leads 105b, and the electric terminals 103b of the circuit board 103. Then, the flexible PWB 111 is heat pressed to the connecter 105 and the end 103a of the board 103 using a heater. With the heat pressing, the flexible PWB 111 contact hard the connecter 105 and the end 103a, and the soldering material is fused by the heat from the heater.

The electronic device 101 of FIG. 5A offers, for example, the following preferable effects.

As shown in FIG. 5C, the bent ends 105e of the leads 105b, which are located on the upper connector surface 105f, are substantially parallel to the upper connector surface 105f, which faces the flexible PWB 111. Therefore, the connector 105 and the circuit board 103 can be readily electrically connected together using the soldering by the heat pressing at the same time when the flexible PWB 111 and the circuit board 103 are electrically connected together. Moreover, as shown in FIGS. 5B and 5C, each bent end 105e of the leads 105b extends substantially orthogonally to the rows L1, L2 of straight ends while the bent ends 105e are in a row. Therefore, the bent ends 105e and the second TERMINALs 111b are relatively readily and expeditiously soldered by heat pressing.

In the manufacturing process of the electronic device 1 of FIG. 2A, the circuit board 3 and the connector 5 need to be steadily fixed when they are connected to the flexible PWB 11. Jigs can be used for fixing the circuit board 3 and the connector 5. The jigs, however, need to be attached before and detached after the connecting. In addition, when the jigs are detached from the circuit board 3 and the connector 5 or when the circuit board 3 and the flexible PWB 11 are accommodated in the case 13, there is a possibility that the positional relation between the circuit board 3 and the connector 5 is undesirably changed to deform the soldered portions and affect the reliability of the electric connection established by heat pressing.

On the other hand, in the electronic device 101 of FIG. 101, the connector body 105a and the lid 113b are molded from an insulating plastic to be integrated. In addition, the circuit board 103 is fixed to the connector body 105a, and the upper connector surface 105f is located outside the circuit board 103 such that the upper connector surface 105f and the circuit board 103 do not overlap. Therefore, it is possible to electrically connect the flexible PWB 111 to the connector 105 and the circuit board 103 while the circuit board 103 is being fixed to the connector body 105a.

As a result, in the manufacturing process of the electronic device 101 of FIG. 5A, the circuit board 3 does not need to be steadily fixed using a jig when electrically connected to the flexible PWB 111. Therefore, the manufacturing process is relatively simple. Moreover, because the circuit board 103 has been fixed to the connector body 105a, there is substantially no possibility that the positional relation between the circuit board 103 and the connector 105 is undesirably changed to deform the soldered portions after the heat pressing. Therefore, the reliability of the electric connection established by heat pressing is held.

In addition, as shown in FIG. 5B, the circuit board 103 includes the electric terminals 103b at its end 103a, to which the flexible PWB 111 is electrically connected, and the bent ends 105e of the leads 105b are located in a row along the end 103a outside the circuit board 103. Therefore, the distance between each bent end 105e and each corresponding electric terminal 103b is relatively short in the electronic device 101 of FIG. 5A. As a result, the dimensions of the flexible PWB 111 are relatively small, so the manufacturing cost of the electronic device 101 is relatively low.

As shown in FIG. 5C, the upper surfaces of the electric terminals 103b and those of the bent ends 105e are substantially at the same level. Therefore, the first and second electric terminals 111a, 111b of the flexible PWB 111 can be respectively soldered to the electric terminals 103b of the circuit board 103 and the bent ends 105e of the leads 105b by heat pressing while the flexible PWB 111 is kept flat. As a result, stress and strain are prevented from being generated in the flexible PWB 111 during the heat pressing.

The circuit board 103 is supported by the peripheral supporting portion 117 at the end 103a of the board 103. Therefore, the flexible PWB 111 readily contacts hard the circuit board 103 when the flexible PWB 111 is heat pressed to the circuit board 103. As a result, the reliability of the electric connection established by heat pressing is improved.

Third Embodiment

Figure 6A:
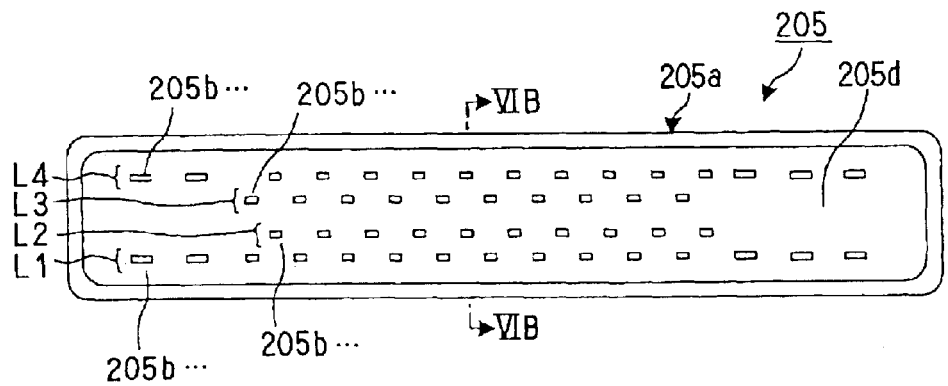
FIG. 6A is a front view of a connector according to a second embodiment showing an arrangement of leads.

An electronic device according to a third embodiment includes an electric connector 205 shown in FIG. 6A. The electric connector 205 includes a connector body 205a and a plurality of leads 205b. The connector body 205a has a rear wall 205d at its rear end in FIG. 6A. Each pin-like straight end of the leads 205b sticks out of the front surface of the rear wall 205d and extends frontward in FIG. 6A. The pin-like straight ends are staggered in four rows L1, L2, L3, L4 that are substantially parallel to one another, as illustrated in FIG. 6A.

Figure 6C:
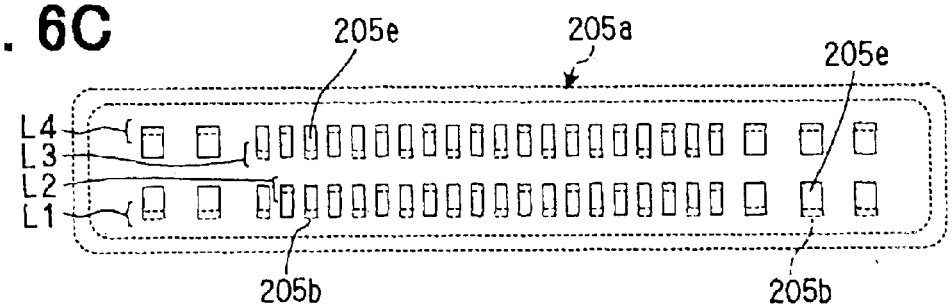
FIG. 6C is a rear view of the connector according to the second embodiment showing the arrangement of the leads.
Figure 7A:
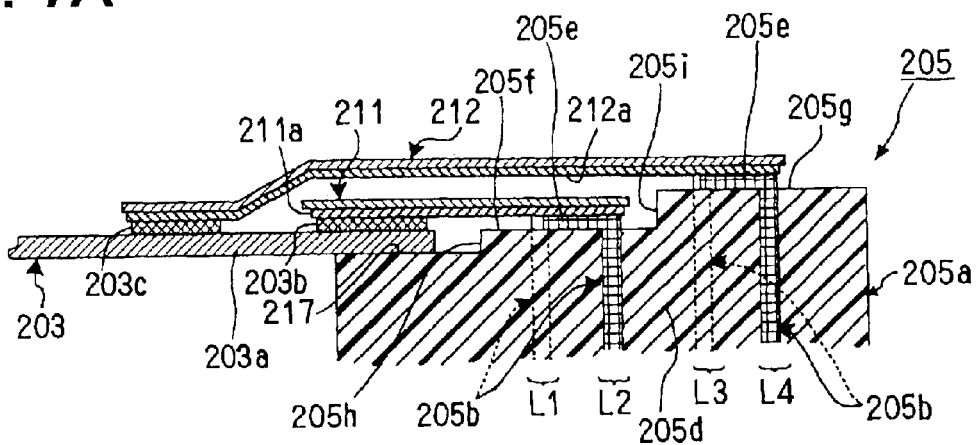
FIG. 7A is a cross-sectional view showing electric connections between flexible PWBs, a connector, and a circuit board according to a third embodiment.

Bent ends of the leads 205b are located on rear surfaces of the rear wall 205d in FIG. 6A. As shown in FIGS. 6C and 7A, the bent ends 205e are substantially parallel to the rear surfaces and extend substantially orthogonally to the rows L1, L2, L3, L4 of straight ends while the bent ends 205e corresponding to the first and second rows L1, L2 of straight ends are in a first row and the bent ends 205e corresponding to the third and fourth rows L3, L4 of straight ends are in a second row. As shown in FIG. 7A, the bent ends 205e in the first row and the bent ends 205e in the second row are electrically connected to a first flexible PWB 211, or a lower flexible PWB 211, and a second flexible PWB 212, or an upper flexible PWB 212, respectively.

Figure 6B:
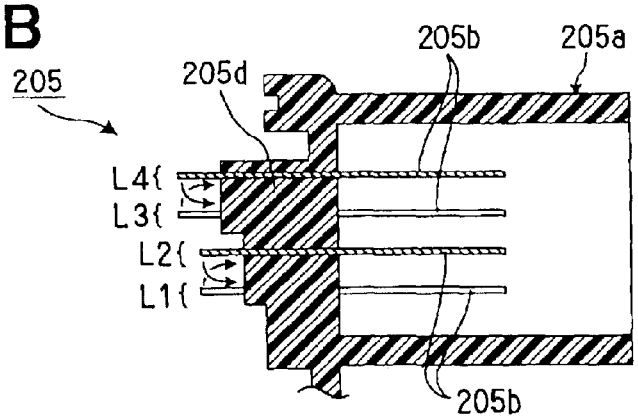
FIG. 6B is a cross-sectional view of the connector taken along the line VIB—VIB in FIG. 6A.

As shown in FIG. 6B, the bent ends 205e are formed by bending ends of straight pins 205b in four rows L1, L2, L3, L4 toward the direction denoted by a corresponding arrow. That is, the ends of the pins 205b in the first row L1 are bent toward the second row L2, and the ends of the pins 205b in the second row L2 are bent toward the first row L1. The ends of the pins 205b in the third row L3 are bent toward the fourth row L4, and the ends of the pins 205b in the fourth row L4 are bent toward the third row L3.

The bent ends 205e in the first row are located on a first upper surface 205f of the rear wall 205d, or a first upper connector surface 205f, as shown in FIG. 7A. The first upper connector surface 205f faces the lower flexible PWB 211. The bent ends 205e in the first row are electrically connected to wires 211a of the lower flexible PWB 211. The wires 211a are also electrically connected to outer electric terminals 203b, which is located along an end 203a of a circuit board 203. That is, the bent ends 205e in the first row and the outer electric terminals 203b are electrically connected by the wires 211a of the lower flexible PWB 211. In the manufacturing process, the bent ends 205e in the first row and the wires 211a are soldered by heat pressing, and so are the outer electric terminals 203b and the wires 211a.

On the other hand, the bent ends 205e in the second row are located on a second upper surface 205g of the rear wall 205d, or a second upper connector surface 205g, as shown in FIG. 7A. The second upper connector surface 205g faces the upper flexible PWB 212. The bent ends 205e in the second row are electrically connected to wires 212a of the upper flexible PWB 212. The wires 212a are also electrically connected to inner electric terminals 203c, which is located along the outer terminal 203c. That is, the bent ends 205e in the second row and the inner electric terminals 203c are electrically connected by the wires 212a of the upper flexible PWB 212. In the manufacturing process, the bent ends 205e in the second row and the wires 212a are soldered by heat pressing and so are the inner electric terminals 203c and the wires 212a.

As shown in FIG. 7A, there is a first step 205h between the horizontal surface of a peripheral supporting portion 217 and the first upper connector surface 205f. The first upper connector surface 205f is located at a level higher than the horizontal surface of the peripheral supporting portion 217, so the upper surfaces of the outer electric terminals 203b on the circuit board 203 and the connection surfaces, or the upper surfaces, of the bent ends 205e in the first row are substantially at the same level. On the other hand, there is a second step 205i between the first upper connector surface 205f and the second upper connector surface 205g. The second upper connector surface 205g is located at a level higher than the first upper connector surface 205f, and the connection surfaces, or the upper surfaces, of the bent ends 205e in the second row are located at a level higher than those of the bent ends 205e in the first row.

The electronic device having the structure of FIG. 7A offers, for example, the following preferable effects.

The bent ends 205e of the leads 205b, which are located on the first and second upper connector surfaces 205f, 205g, are substantially parallel to the first and second upper connector surfaces 205f, 205g, which respectively face the lower and upper flexible PWBs 211, 212. Therefore, the connector 205 and the circuit board 203 can be readily electrically connected together using the soldering by heat pressing. Moreover, as shown in FIG. 7A, the bent ends 205e in the first row extend substantially orthogonally to the first and second rows L1, L2 of straight ends while the bent ends 205e are in a row. Therefore, the bent ends 205e in the first row and the wires 211a of the lower flexible PWB 211 are expeditiously soldered by heat pressing.

Although not illustrated in the drawings, the connector body 205a and a lid are molded from an insulating plastic to be integrated. The circuit board 203 is fixed to the connector body 205a, and the upper connector surfaces 205f, 205g are located outside the circuit board 203. Therefore, when the flexible PWBs 211, 212 are heat pressed to the circuit board 203, the circuit board 203 does not need to be steadily fixed using a jig. Therefore, the manufacturing process is relatively simple. Moreover, because the circuit board 203 has been fixed to the connector body 205a, there is substantially no possibility that the positional relation between the circuit board 203 and the connector 205 is undesirably changed to deform the soldered portions after the heat pressing. Therefore, the reliability of the electric connection established by heat pressing is held.

In addition, as shown in FIG. 7A, the circuit board 203 includes the outer and inner electric terminals 203b, 203c at its end 203a, to which the lower and upper flexible PWBs 211, 212 are respectively electrically connected, and the first and second rows of bent ends 205e are located along the end 203a outside the circuit board 203. Therefore, the distance between each of the bent ends 205e and each corresponding terminal 203b, 203c is relatively short. As a result, the dimensions of each flexible PWB 211, 212 are relatively small, so the manufacturing cost is relatively low.

The upper surfaces of the outer electric terminals 203b and those of the bent ends 205e in the first row are substantially at the same level. Therefore, the wires 211a of the lower flexible PWB 211 are soldered to the outer electric terminals 203b of the circuit board 203 and the bent ends 205e in the first row by heat pressing while the lower flexible PWB 211 is kept flat. As a result, stress and strain are prevented from being generated in the lower flexible PWB 211 during the heat pressing.

The circuit board 203 is supported by the peripheral supporting portion 217 at the end 203a of the board 203. Therefore, the flexible PWBs 211, 212 readily contact hard the circuit board 203 when the flexible PWBs 211, 212 are heat pressed to the circuit board 203. As a result, the reliability of the electric connection established by heat pressing is improved.

As shown in FIG. 7A, the bent ends 205e in the second row extend substantially orthogonally to the third and fourth rows L3, L4 of straight ends while the bent ends 205e are in a row. Therefore, the bent ends 205e in the second row and the wires 212a of the upper flexible PWB 212 are expeditiously soldered by heat pressing.

As illustrated in FIG. 7A, the upper surfaces of the bent ends 205e in the second row are higher than those of the bent ends 205e in the first row. Therefore, it is possible to prevent the upper flexible PWB 212 from contacting the lower flexible PWB 211. As a result, the wires 212a of the upper flexible PWB 212 are readily soldered to the inner electric terminals 203c of the circuit board 203 and the bent ends 205e in the second row by heat pressing.

Fourth Embodiment

Figure 7B:
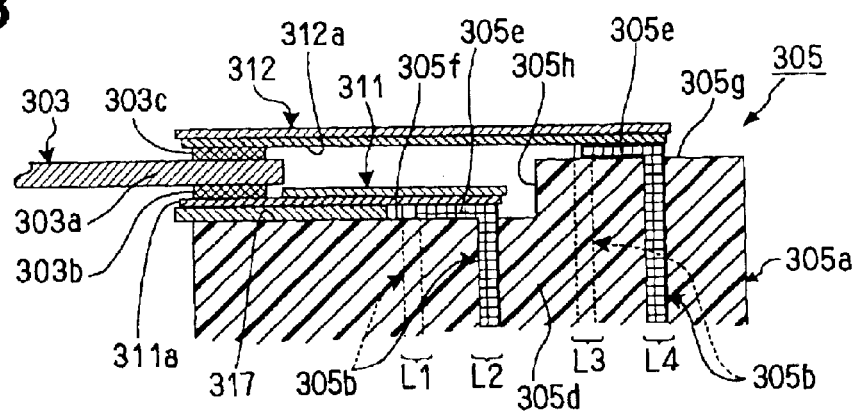
FIG. 7B is a cross-sectional view showing electric connections between flexible PWBs, a connector, and a circuit board according to a fourth embodiment.

In the circuit board 203 of FIG. 7A, the outer and inner electric terminals 203b, 203c are located on the same side, and the lower and upper flexible PWBs 211, 212 are heat pressed to the circuit board 203 on the same side. Therefore, the electric terminals 203b, 203c occupy a relatively large area. On the other hand, as shown in FIG. 7B, in a circuit board 303 according to a fourth embodiment, lower electric terminals 303b and upper electric terminals 303c are respectively located on a first surface, or a lower surface, and on a second surface, or an upper surface. First and second flexible PWBs 311, 312, or lower and upper flexible PWBs 311, 312 are heat pressed to the circuit board 303 on the lower and upper surfaces, respectively.

In the manufacturing process, wires 311a of the lower flexible PWB 311 and the lower electric terminals 303b, which are located at a connecting portion, or an end 303a, of the circuit board 303, are soldered by heat pressing. Then, the circuit board 303 is fixed to a connector body 305a of a connector 305, and the wires 311a of the lower flexible PWB 311 and the bent ends 305e in a first row, which correspond to first and second rows L1, L2 of leads 305b, are soldered by heat pressing. As a result, the lower electric terminals 303b of the circuit board 303 and the leads 305b corresponding to first and second rows L1, L2 are electrically connected by the lower flexible PWB 311.

Next, wires 312a of the upper flexible PWB 312 and the upper electric terminals 303c, which are located at the end 303a, are soldered, and the wires 312a and the bent ends 305e in a second row, which correspond to third and fourth rows L3, L4, are soldered by heat pressing. As a result, the upper electric terminals 303c of the circuit board 303 and the leads 305b corresponding to the third and fourth rows L3, L4 are electrically connected by the upper flexible PWB 312.

The bent ends 305e in the first row are located on a first upper connector surface 305f, as shown in FIG. 7B. The first upper connector surface 305f faces the lower flexible PWB 311. On the other hand, the bent ends 305e in the second row are located on a second upper connector surface 305g. The second upper connector surface 305g faces the upper flexible PWB 312. As shown in FIG. 7A, the horizontal surface of a peripheral supporting portion 317 is substantially at the same level as the first upper connector surface 305f.

As shown in FIG. 7A, the lower surfaces of the lower electric terminals 303b of the circuit board 303 and the connection surfaces, or the upper surfaces, of the bent ends 305e in the first row are substantially at the same level. On the other hand, there is a step 305h between the first upper connector surface 305f and the second upper connector surface 305g. The second upper connector surface 305g is located at a level higher than the first upper connector surface 305f such that the connection surfaces, or the upper surfaces, of the bent ends 305e in the second row are located at a level higher than those of the bent ends 305e in the first row and substantially at the same level as the upper surfaces of the upper electric terminals 303c of the circuit board 303.

The electronic device having the structure of FIG. 7B offers, for example, the following preferable effects.

The bent ends 305e of the leads 305b, which are located on the first and second upper connector surfaces 305f, 305g, are substantially parallel to the first and second upper connector surfaces 305f, 305g, which respectively face the lower and upper flexible PWBs 311, 312. Therefore, the connector 305 and the circuit board 303 can be readily electrically connected together using the soldering by heat pressing. Moreover, as shown in FIG. 7B, the bent ends 305e in the first row extend substantially orthogonally to the first and second rows L1, L2 of the leads 305b while the bent ends 305e are in a row. Therefore, the bent ends 305e in the first row and the wires 311a of the lower flexible PWB 311 are expeditiously soldered by heat pressing.

Although not illustrated in the drawings, the connector body 305a and a lid are molded from an insulating plastic to be integrated. The circuit board 303 is fixed to the connector body 305a, and the upper connector surfaces 305f, 305g are located outside the circuit board 303. Therefore, when the flexible PWBs 311, 312 are heat pressed to the circuit board 303, the circuit board 303 does not need to be steadily fixed using a jig. Therefore, the manufacturing process is relatively simple. Moreover, because the circuit board 303 has been fixed to the connector body 305a, there is substantially no possibility that the positional relation between the circuit board 303 and the connector 305 is undesirably changed to deform the soldered portions after the heat pressing. Therefore, the reliability of the electric connection established by heat pressing is held.

In addition, as shown in FIG. 7B, the circuit board 303 includes the lower and upper electric terminals 303b, 303c at its end 303a, to which the lower and upper flexible PWBs 311, 312 are respectively electrically connected, and the bent ends 305e in the first and second rows are located along the end 303a outside the circuit board 303. Therefore, the distance between each of the bent ends 305e and each corresponding electric terminal 303b, 303c is relatively short. As a result, the dimensions of each flexible PWB 311, 312 are relatively small, so the manufacturing cost is relatively low.

The lower surfaces of the lower electric terminals 303b and the upper surfaces of the bent ends 305e in the first row are substantially at the same level. Therefore, the wires 311a of the lower flexible PWB 311 are soldered to the bent ends 305e in the first row by heat pressing while the lower flexible PWB 311 is kept flat. As a result, stress and strain are prevented from being generated in the lower flexible PWB 311 during the heat pressing.

The upper surfaces of the upper electric terminals 303c and the upper surfaces of the bent ends 305e in the second row are substantially at the same level. Therefore, the wires 312a of the upper flexible PWB 312 are soldered to the circuit board 303 and the bent ends 305e in the second row by heat pressing while the upper flexible PWB 312 is kept flat. As a result, stress and strain are prevented from being generated in the upper flexible PWB 312 during the heat pressing.

The circuit board 303 is supported by the peripheral supporting portion 317 at the end 303a of the board 303. Therefore, the upper flexible PWB 312 readily contacts hard the circuit board 303 when the upper flexible PWB 312 is heat pressed to the circuit board 303. As a result, the reliability of the electric connection established by heat pressing is improved.

As shown in FIG. 7B, the bent ends 305e in the second row extend substantially orthogonally to the third and fourth rows L3, L4 of the leads 305b while the bent ends 305e are in a row. Therefore, the bent ends 305e in the second row and the wires 312a of the upper flexible PWB 312 are relatively readily and expeditiously soldered by heat pressing.

As illustrated in FIG. 7B, the upper surfaces of the bent ends 305e in the second row are higher than those of the bent ends 305e in the first row. Therefore, it is possible to prevent the upper flexible PWB 312 from contacting the lower flexible PWB 311. As a result, the wires 312a of the upper flexible PWB 312 are readily soldered to the upper electric terminals 303c of the circuit board 303 and the bent ends 305e in the second row by heat pressing.

As shown in FIG. 7B, in the circuit board 303, the lower electric terminals 303b and the upper electric terminals 303c are respectively located on the lower surface and on the upper surface at the end 303a. The lower and upper flexible PWBs 311, 312 are heat pressed to the circuit board 303 on the lower and upper surfaces, respectively, in the manufacturing process. Therefore, the total area of the lower and upper electric terminals 303b, 303c in the circuit board 303 of FIG. 7B can be smaller than that in the circuit board 203 of FIG. 7A. Thus, the circuit board 303 of FIG. 7B can be more flexible in wiring pattern layout than that in the circuit board 203 of FIG. 7A.

Fifth Embodiment

Figure 7C:
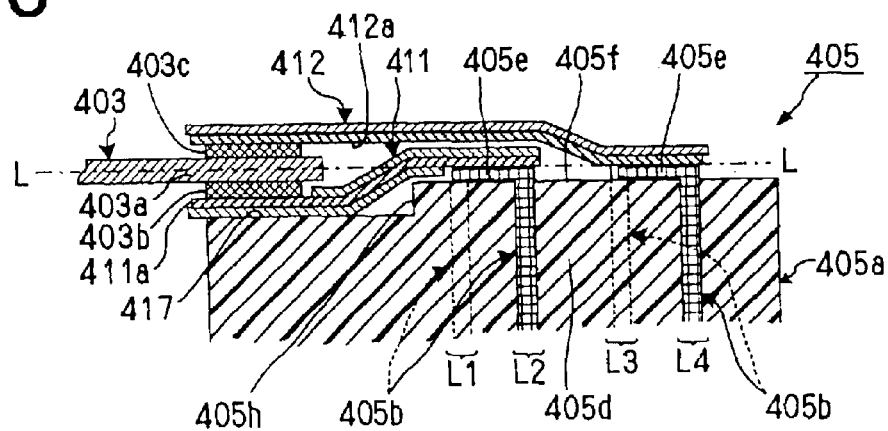
FIG. 7C is a cross-sectional view showing electric connections between flexible PWBs, a connector, and a circuit board according to a fifth embodiment.

In the connector 305 of FIG. 7B, the upper surfaces of the bent ends 305e in the first row, which correspond to the first and second rows L1, L2 of the leads 305b, are at a different level than those of the bent ends 305e in the second row, which correspond to the third and fourth rows L3, L4. On the other hand, in a connector 405 according to a fifth embodiment, bent ends 405e are located on an upper connector surface 405f, as shown in FIG. 7C. The upper connector surface 405f faces lower and upper flexible PWBs 411 and 412. The connection surfaces, or the upper surfaces, of the bent ends 405e in a first row, which correspond to first and second rows L1, L2 of the leads 305b, are substantially at the same level as those of the bent ends 405e in a second row, which correspond to third and fourth rows L3, L4.

A circuit board 403 is supported at its end 403a by a peripheral supporting portion 417 with the lower flexible PWB 411 in-between. There is a first step 405h between the horizontal surface of the peripheral supporting portion 417 and the upper connector surface 405f. The upper connector surface 405f is located at a level higher than the horizontal surface of the peripheral supporting portion 417. As a result, the upper surfaces of the bent ends 405e are substantially on the median level of the circuit board 403, which is depicted by line L—L in FIG. 7C.

The electronic device having the structure of FIG. 7C offers, for example, the following preferable effects.

The bent ends 405e of the leads 405b, which are located on the upper surfaces 405f, are substantially parallel to the upper surfaces 405f, which faces the lower and upper flexible PWBs 411, 412. Therefore, the connector 405 and the circuit board 403 can be readily electrically connected together using the soldering by heat pressing. Moreover, as shown in FIG. 7C, the bent ends 405e of the leads 405b in the first row extend substantially orthogonally to the first and second rows L1, L2 of the leads 305b while the bent ends 405e are in a row. Therefore, the bent ends 405e and wires 411a of the lower flexible PWB 411 are relatively readily and expeditiously soldered by heat pressing.

Although not illustrated in the drawings, a connector body 405a of the connector 405 and a lid are molded from an insulating plastic to be integrated. The circuit board 403 is fixed to the peripheral supporting portion 417 of the connector body 405a, and the upper connector surface 405f are located outside the circuit board 403 such that the upper connector surface 405f and the circuit board 403 do not overlap. Therefore, in the heat pressing of the flexible PWBs 411, 412 to the electric connector 405, the circuit board 403 does not need to be steadily fixed using a jig. Therefore, the manufacturing process is relatively simple. Moreover, because the circuit board 403 has been fixed to the lid, there is substantially no possibility that the positional relation between the circuit board 403 and the connector 405 is undesirably changed to deform the soldered portions after the heat pressing. Therefore, the reliability of the electric connection established by heat pressing is held.

In addition, as shown in FIG. 7C, the circuit board 403 includes the lower and upper electric terminals 403b, 403c at its end 403a, to which the lower and upper flexible PWBs 411, 412 are respectively electrically connected, and the bent ends 405e are located along the end 403a outside the circuit board 403. Therefore, the distance between each of the bent ends 405e and each corresponding electric terminal 403b, 403c is relatively short. As a result, the dimensions of each flexible PWB 411, 412 are relatively small, so the manufacturing cost is relatively low.

The circuit board 403 is supported by the peripheral supporting portion 417 at the end 403a of the board 403. Therefore, the upper flexible PWB 412 readily contacts hard the circuit board 403 when the upper flexible PWB 412 is heat pressed to the circuit board 403. As a result, the reliability of the electric connection established by heat pressing is improved.

As shown in FIG. 7C, the bent ends 405e in the second row extend substantially orthogonally to the third and fourth rows L3, L4 of the leads 305b while the bent ends 405e are in a row. Therefore, the bent ends 405e in the second row and wires 412a of the upper flexible PWB 412 are relatively readily and expeditiously soldered by heat pressing.

As shown in FIG. 7C, in the circuit board 403, the lower electric terminals 403b and the upper electric terminals 403c are respectively located on the lower surface and on the upper surface at the end 403a. The lower and upper flexible PWBs 411, 412 are heat pressed to the circuit board 403 on the lower and upper surfaces, respectively, in the manufacturing process. Therefore, the total area of the lower and upper electric terminals 403b, 403c in the circuit board 403 of FIG. 7C can be smaller than that in the circuit board 203 of FIG. 7A. Thus, the circuit board 403 of FIG. 7C can be more flexible in wiring pattern layout than that in the circuit board 203 of FIG. 7A.

The upper surfaces of bent ends 405e in the first row are substantially at the same level as those of the bent ends 405e in the second row. In addition, the upper surfaces of the bent ends 405e are substantially at the same level as the median level of the circuit board 403. Therefore, the wires 411a, 412a of the flexible PWBs 411, 412 are readily soldered by heat pressing to the electric terminals 403b, 403c on the circuit board 403 and the bent ends 405e of leads 405b on the connector 405. In addition, even if a stress is generated in the flexible PWBs 411, 412, the stress can relax due to the above structure.

While the present invention has been shown and described with reference to the foregoing preferred embodiment, it will be apparent to those skilled in the art that changes in form and detail may be made therein without departing from the scope of the invention as defined in the appended claims.

What is claimed is:

1. An electronic device comprising:
   a circuit board, which includes an electronic circuit;
   a first flexible printed wiring board, which is electrically connected to the electronic circuit, said flexible printed wiring board including first and second electrode patterns; and
   an electric connector, which includes a plurality of first leads and a connector body having an opening and a rear surface, wherein the plurality of first leads penetrate through the rear surface of the connector body, wherein each first lead has a first, substantially straight end exposed at the opening and has a second bent end facing the rear surface, wherein the rear surface of the connector body is substantially parallel to a surface of the flexible printed wiring board, wherein each of the second bent end of the first leads has a first side surface facing the rear surface and a second surface connected to one of the first and second electrode patterns, so that the rear surface of the connector and each of the second bent end are arranged substantially parallel to the flexible printed wiring board at a portion where the one of the first and second electrode patterns is disposed, and wherein the connector is electrically connected to the first flexible printed wiring board through said one of the first and second electrode patterns.

2. The electronic device in claim 1, wherein the straight ends are in two rows substantially parallel to each other and wherein the bent ends extend substantially orthogonally to the two rows to form the bent ends in a row.

3. The electronic device in claim 2 further comprising a second flexible printed wiring board, which is electrically connected to the circuit board, wherein the electric connector includes a plurality of second leads, each of which has a straight end and a bent end, wherein each bent end of the second leads is located on a surface of the connector body to be substantially parallel to the second flexible printed wiring board, wherein the connector is electrically connected to the second flexible printed wiring board using the second leads, wherein the straight ends of the second leads are in two rows substantially parallel to each other, and wherein the bent ends of the second leads extend substantially orthogonally to the two rows of the straight ends of the second leads to form the bent ends of the second leads in a row.

4. The electronic device in claim 3, wherein the circuit board has a connecting portion that has first and second surfaces, which are opposite to each other, wherein the first flexible printed wiring board is electrically connected to the first surface of the connecting portion, and wherein the second flexible printed wiring board is electrically connected to the second surface of the connecting portion.

5. The electronic device in claim 4, wherein the bent ends of the first leads are located between the circuit board and the bent ends of the second leads, wherein each bent end of the first leads has a connection surface that faces the first flexible printed wiring board, wherein each bent end of the second leads has a connection surface that faces the second flexible printed wiring board, and wherein the connection surfaces are located substantially on a median level of the circuit board.

6. The electronic device in claim 3, wherein the bent ends of the first leads are located between the circuit board and the bent ends of the second leads, wherein each bent end of the first leads has a connection surface that faces the first flexible printed wiring board, wherein each bent end of the second leads has a connection surface that faces the second flexible printed wiring board, wherein the connection surfaces of the bent ends of the first leads are located on a level different from that on which the connection surfaces of the bent ends of the second leads are located such that the flexible printed wiring boards are prevented from contacting each other.

7. The electronic device in claim 1 further comprising a case component, which is integrated with the connector body, wherein the connector body includes a supporting portion at which the circuit board is fixed to the connector, wherein the circuit board includes a plurality of electric terminals at an end of the board, which electrically connected to the first flexible printed wiring board, and wherein the bent ends of the first leads are located in a row along the end of the circuit board outside the circuit board.

8. The electronic device in claim 7, wherein a surface of each electric terminal and a surface of each bent end of the first leads are substantially at the same level.

9. An electronic device according to claim 1, wherein said connector body is integrally formed in at least one part of a case containing said circuit board.

10. An electronic device according to claim 9, wherein said connector body is formed in a lid for said case.

11. An electronic device according to claim 1, wherein the first flexible printed wiring board is electrically connected to the electronic circuit of the circuit board through the other of the first and second electrode patterns.

12. An electronic device according to claim 11, wherein the connection between the one of the first and second electrode patterns of the flexible printed wiring board and the bent ends of the first leads is formed using a same connection method as used for the connection between the circuit board and the flexible printed wiring board at the other of the first and second electrode patterns.

13. An electronic device according to claim 12, wherein the flexible printed wiring board and the bent ends of the first leads are connected by heat pressing soldering.

14. An electronic device according to claim 1, wherein the flexible printed wiring board and the bent ends of the first leads are connected by heat pressing soldering.

* * * * *